(12) United States Patent
Chen et al.

(10) Patent No.: US 10,790,261 B2
(45) Date of Patent: Sep. 29, 2020

(54) BONDING THROUGH MULTI-SHOT LASER REFLOW

(71) Applicant: Taiwan Semiconductor Manufacturing Company, Ltd., Hsinchu (TW)

(72) Inventors: Wei-Yu Chen, Taipei (TW); Chia-Shen Cheng, Hsinchu (TW); Hao-Jan Pei, Hsinchu (TW); Philip Yu-Shuan Chung, Taipei (TW); Kuei-Wei Huang, Hsinchu (TW); Yu-Peng Tsai, Taipei (TW); Hsiu-Jen Lin, Zhubei (TW); Ching-Hua Hsieh, Hsinchu (TW); Chen-Hua Yu, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/121,888

(22) Filed: Sep. 5, 2018

(65) Prior Publication Data
US 2019/0279958 A1 Sep. 12, 2019

Related U.S. Application Data

(60) Provisional application No. 62/641,613, filed on Mar. 12, 2018.

(51) Int. Cl.
| | |
|---|---|
| *H01L 23/00* | (2006.01) |
| *H01L 23/31* | (2006.01) |
| *H01L 23/498* | (2006.01) |
| *H01L 21/56* | (2006.01) |

(52) U.S. Cl.
CPC .............. *H01L 24/81* (2013.01); *H01L 21/56* (2013.01); *H01L 23/3114* (2013.01); *H01L 23/49822* (2013.01); *H01L 24/17* (2013.01); *H01L 2224/175* (2013.01); *H01L 2224/81224* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 10,304,698 B2 * | 5/2019 | Yoon | H01L 24/81 |
| 2016/0190079 A1 | 6/2016 | Liao et al. | |
| 2018/0366450 A1 * | 12/2018 | Gardner | H01L 25/0753 |
| 2019/0279958 A1 * | 9/2019 | Chen | H01L 24/81 |
| 2019/0341525 A1 * | 11/2019 | Danesh | H01L 33/0095 |

FOREIGN PATENT DOCUMENTS

TW 201737444 A 10/2017

\* cited by examiner

*Primary Examiner* — Long Pham
(74) *Attorney, Agent, or Firm* — Slater Matsil, LLP (57) ABSTRACT

A method includes performing a first laser shot on a first portion of a top surface of a first package component. The first package component is over a second package component, and a first solder region between the first package component and the second package component is reflowed by the first laser shot. After the first laser shot, a second laser shot is performed on a second portion of the top surface of the first package component. A second solder region between the first package component and the second package component is reflowed by the second laser shot.

20 Claims, 12 Drawing Sheets

BONDING THROUGH MULTI-SHOT LASER REFLOW

PRIORITY CLAIM AND CROSS-REFERENCE

This application claims the benefit of the following provisionally filed U.S. Patent application: Application Ser. No. 62/641,613, filed Mar. 12, 2018, and entitled "Multi-Shot Reflow of Solder Regions," which application is hereby incorporated herein by reference.

BACKGROUND

In the packaging of integrated circuits, device dies or packages are packaged onto package substrates, which include metal connections that are used to route electrical signals between opposite sides of the package substrates. The device dies may be bonded onto one side of a package substrate using flip chip bonding, and a reflow is performed to melt the solder balls that interconnect the dies and the package substrate.

The package substrates may use materials that can be easily laminated. In addition, organic materials may be used as the dielectric materials of the package substrate. These materials, however, are prone to warpage caused by elevated temperatures used in the reflow of the solder. Furthermore, during the bonding process, since the device dies and the package substrates have significantly different Coefficients of Thermal Expansion (CTEs), the warpage in the dies and the package substrates is worsened. For example, the silicon in the device dies has a CTE close to about 3.2, while the package substrates may have a CTE between about 10 and 17, or even higher. The warpage in the package substrates may cause cold joints and/or bump cracks. As a result, the yield of the packaging process is adversely affected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 4A illustrate the cross-sectional views of intermediate stages in a bonding process through a multi-shot laser reflow process in accordance with some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and methods of forming the package using a multi-shot reflow process are provided in accordance with some embodiments of the present disclosure. The intermediate stages of forming the package are illustrated in accordance with some embodiments. Some variations of some embodiments are discussed. Throughout the various views and illustrative embodiments, like reference numbers are used to designate like elements.

Figure 10:
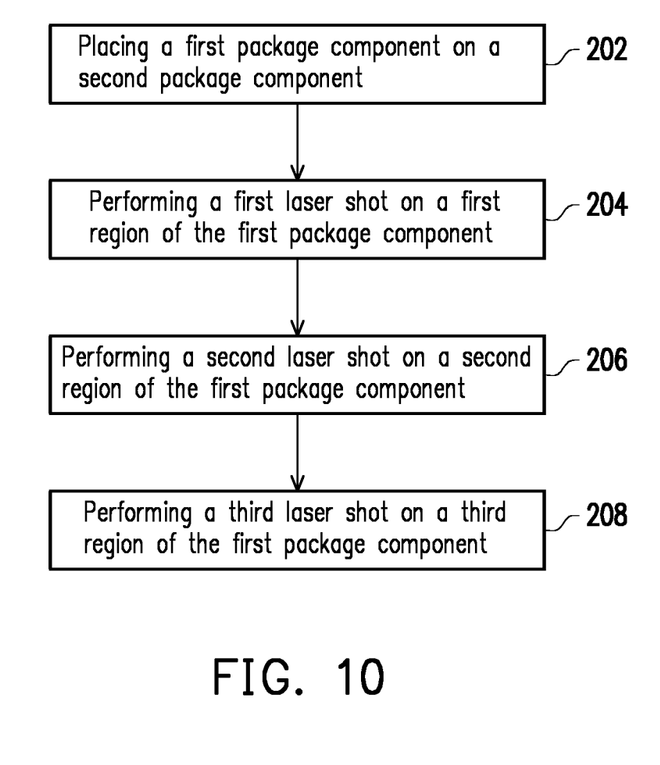
FIG. 10 illustrates a process flow of a multi-shot laser reflow process in accordance with some embodiments.

FIGS. 1 through 4A illustrate the cross-sectional views of intermediate stages in a bonding process in accordance with some embodiments of the present disclosure. The steps shown in FIGS. 1 through 4A are also reflected schematically in the process flow shown in FIG. 10.

Figure 1:
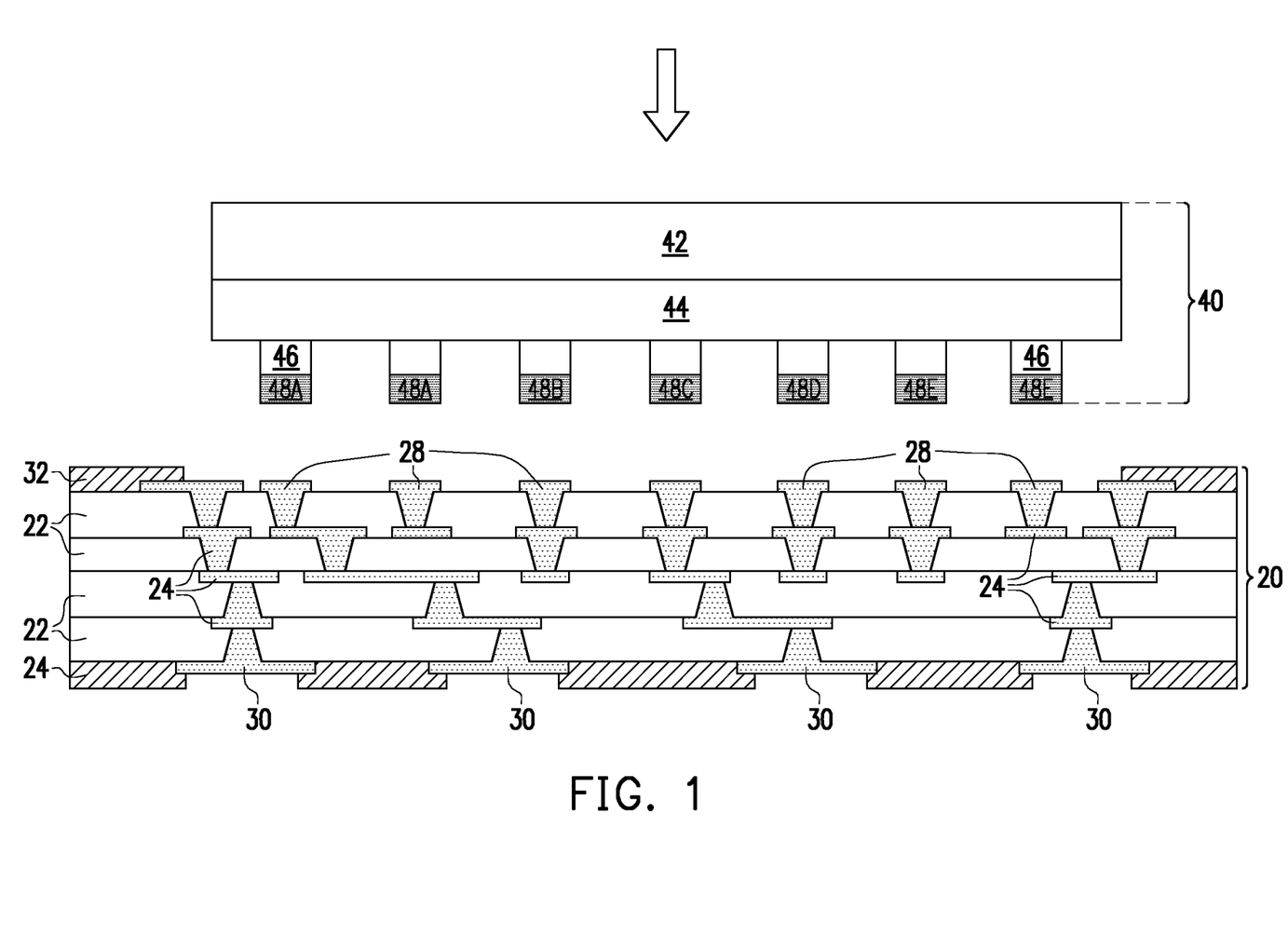

Referring to FIG. 1, package component 20 is provided. In accordance with some embodiments of the present disclosure, package component 20 is a package substrate, an interposer die, a package, or the like. When being a package substrate, package component 20 may be a coreless substrate or a substrate having a core. For example, FIG. 1 illustrates a coreless substrate, which includes a plurality of dielectric layers 22 and RDLs 24 formed in dielectric layers 22. Dielectric layers 22 is formed of a dielectric material including, and not limited to, epoxy, resin, glass fiber, prepreg (which comprises epoxy, resin, and/or glass fiber), resin coated Copper (RCC), glass, molding compound, plastic (such as PolyVinylChloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), flex (polyimide), combinations thereof, and multi-layers thereof. RDLs 24, which include metal lines and vias, are formed in dielectric layers 22.

In accordance with alternative embodiments of the present disclosure, package component 20 is a substrate with a core, which includes a plurality of metal pipes (not shown) in a core dielectric material (not shown). In accordance with some embodiments of the present disclosure, the core dielectric material comprises one or more material selected from epoxy, resin, glass fiber, prepreg (which comprises epoxy, resin, and/or glass fiber), RCC, glass, molding compound, plastic (such PVC, ABS, PP, PE, PS, PMMA, PET, PC, PPS, and flex (a polyimide)), combinations thereof, and multi-layers thereof. Metal pipes (not shown) are formed to penetrate through the core dialectic material. Dielectric layers (similar to 22) and RDLs (similar to 24) are formed on opposite sides of the core, with the RDLs connected to the metal pipes in the core.

In accordance with alternative embodiments of the present disclosure, package component 20 includes an interposer, which may include a substrate (such as a silicon substrate or a dielectric substrate), and metal lines and vias formed over the substrate. Through-vias may be formed to penetrate through the substrate.

In accordance with alternative embodiments of the present disclosure, package component 20 includes a package, which may be an InFO (Integrated Fan-Out) package, a Package-on-Package (PoP) package, or the like. Molding compound and polymer layers may be used in the package to mold device dies, and hence package component 20 has a high Coefficient of Thermal Expansion (CTE).

Package component 20 also includes top conductive features 28 at the top surface of package component 20, and bottom conductive features 30 at the bottom of package component 20. Top conductive features 28 are electrically connected to bottom conductive features 30 through the metal lines and vias of the RDLs 24 (and metal pipes and through-vias, if any) inside package component 20. Accordingly, package component 20 is configured to route electrical signals and power from the top side to the bottom side of package component 20. There may be dielectric layers (such as solder masks) 32 and 34 formed at the top surface and the bottom surface of package component 20, with top conductive features 28 and bottom conductive features 30 exposed through the openings in dielectric layers 32 and 34, respectively. Top conductive features 28 may have small sizes and small pitches. For example, the pitches may be smaller than about 130 µm, and may be smaller than about 100 µm. In accordance with some embodiments of the present disclosure, top conductive features 28 are metal bumps or pads protruding above the top surface of surrounding dielectric layer 22. In accordance with other embodiments of the present disclosure, top conductive features 28 are metal pads with top surfaces coplanar with the top surface of surrounding dielectric layer 22. In accordance with yet other embodiments of the present disclosure, top conductive features 28 are metal traces protruding above the top surface of surrounding dielectric layer 22.

Also referring to FIG. 1, package component 40 is aligned to and placed on package component 20. The respective process is illustrated as process 202 in the process flow shown in FIG. 10. Package component 40 may be a logic circuit die, a memory die, or the like. For example, package component 40 may be a logic die such as a Central Processing Unit (CPU) die, a Micro Control Unit (MCU) die, an input-output (IO) die, a BaseBand (BB) die, an Application processor (AP) die, or the like. Package component 40 may also be a memory die such as a Static Random Access Memory (SRAM) die, a Dynamic Random Access Memory (DRAM) die, or the like. Package component 40 may include substrate 42 and interconnect structure 44. Substrate 42 may be a semiconductor substrate such as a silicon substrate, a silicon carbon substrate, a silicon germanium substrate, or formed of other semiconductor materials such as III-V compound semiconductors. Interconnect structure 44 includes metal lines and vias (not shown) formed therein. Conductive features 46 are formed at the surface of package component 40. Conductive features 46 may be metal pillars (such as copper pillars), metal pads, metal traces, or the like. Also, there may be nickel layers, gold layers, or the like formed at the surfaces of conductive features 46. In accordance with some embodiments, conductive features 46 may be metallic features.

In accordance with some embodiments of the present disclosure, solder regions 48 are formed at the surfaces of conductive features 46. Solder regions 48 (including 48A, 48B, 48C, 48D, and 48E) may be plated on conductive features 46, and hence have planar bottom surfaces as illustrated in FIG. 1. Solder regions 48 may also be reflowed, so that solder regions 48 have rounded surfaces. With package component 40 being placed on package component 20, solder regions 48 are in contact with top conductive features 28. In accordance with other embodiments, instead of forming solder regions 48 as parts of package component 40, solder regions 48 are formed as a parts of package component 20. In accordance with yet other embodiments, both package component 20 and package component 40 include solder regions, and after the placement, the solder regions in package component 20 are in contact with the corresponding solder regions in package component 40. Solder regions 48 include 48A, 48B, 48C, 48D, and 48E, which are collectively and individually referred to as solder regions 48. Each of solder regions 48A, 48B, 48C, 48D, and 48E may represent a plurality of (such as one or more row or one or more column) of solder regions 48.

Figure 2:
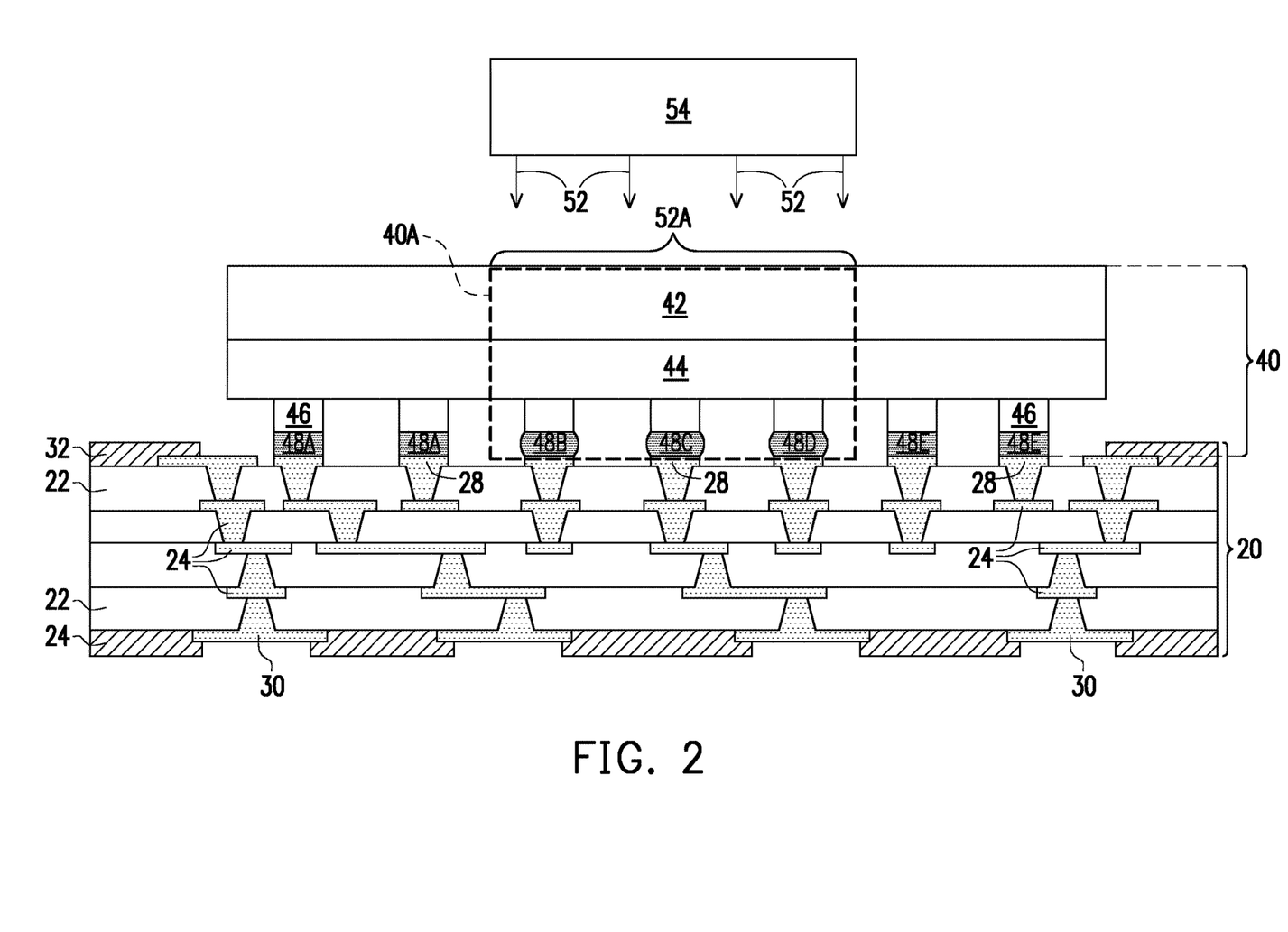
Figure 3:
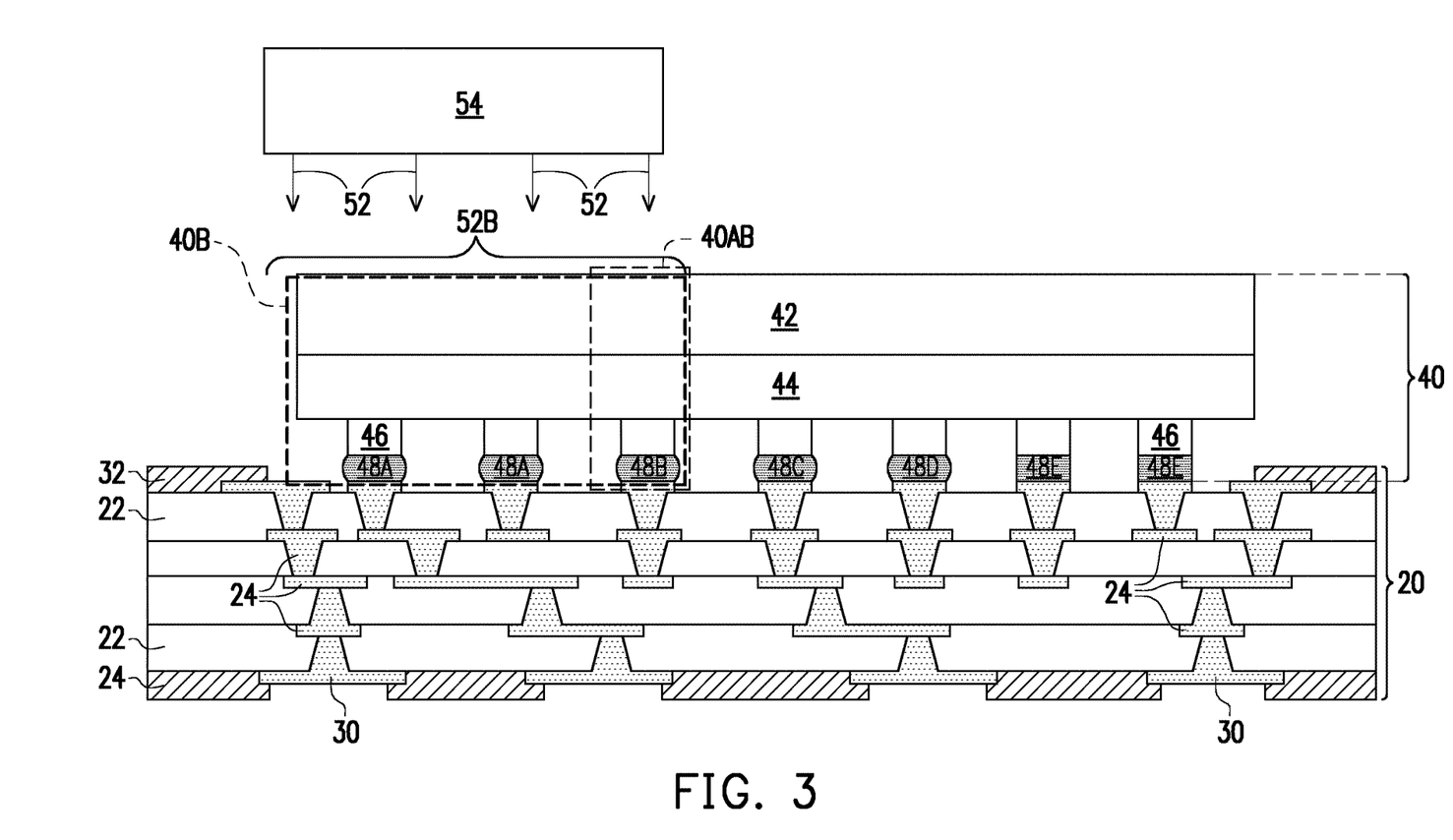
Figure 4A:
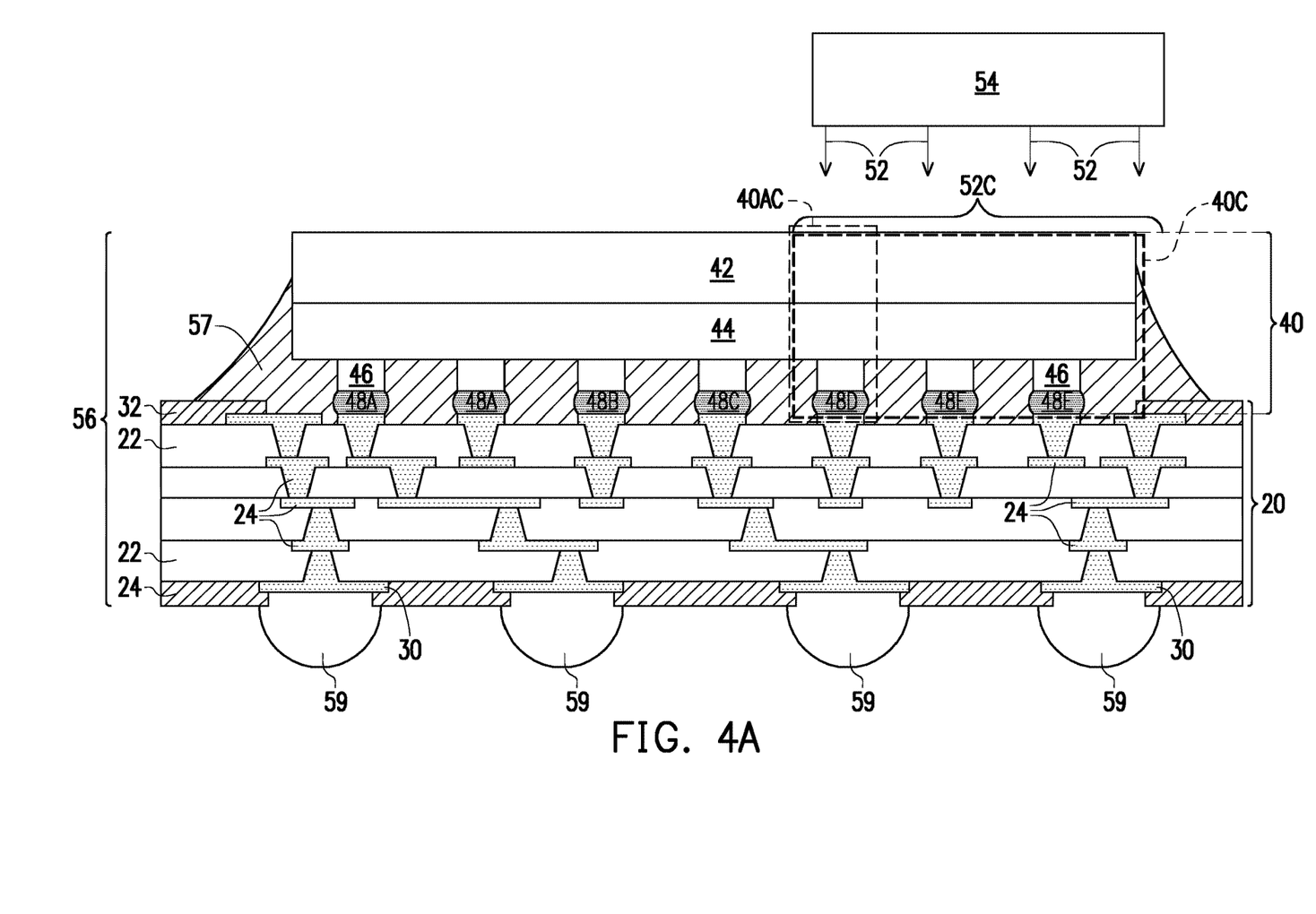
Figure 4B:
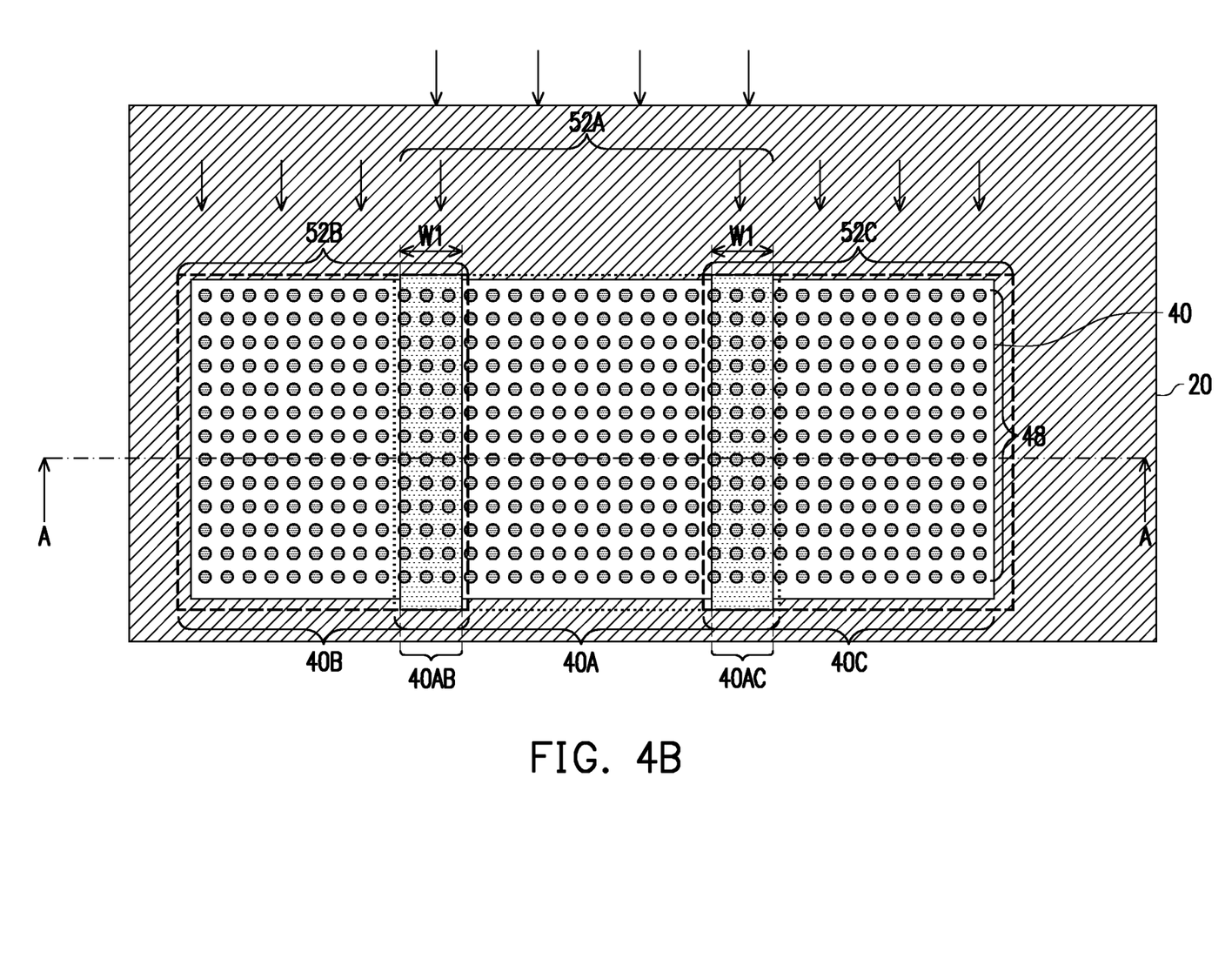
FIG. 4B illustrates a top view in a bonding process through a multi-shot laser reflow process in accordance with some embodiments.
Figure 5:
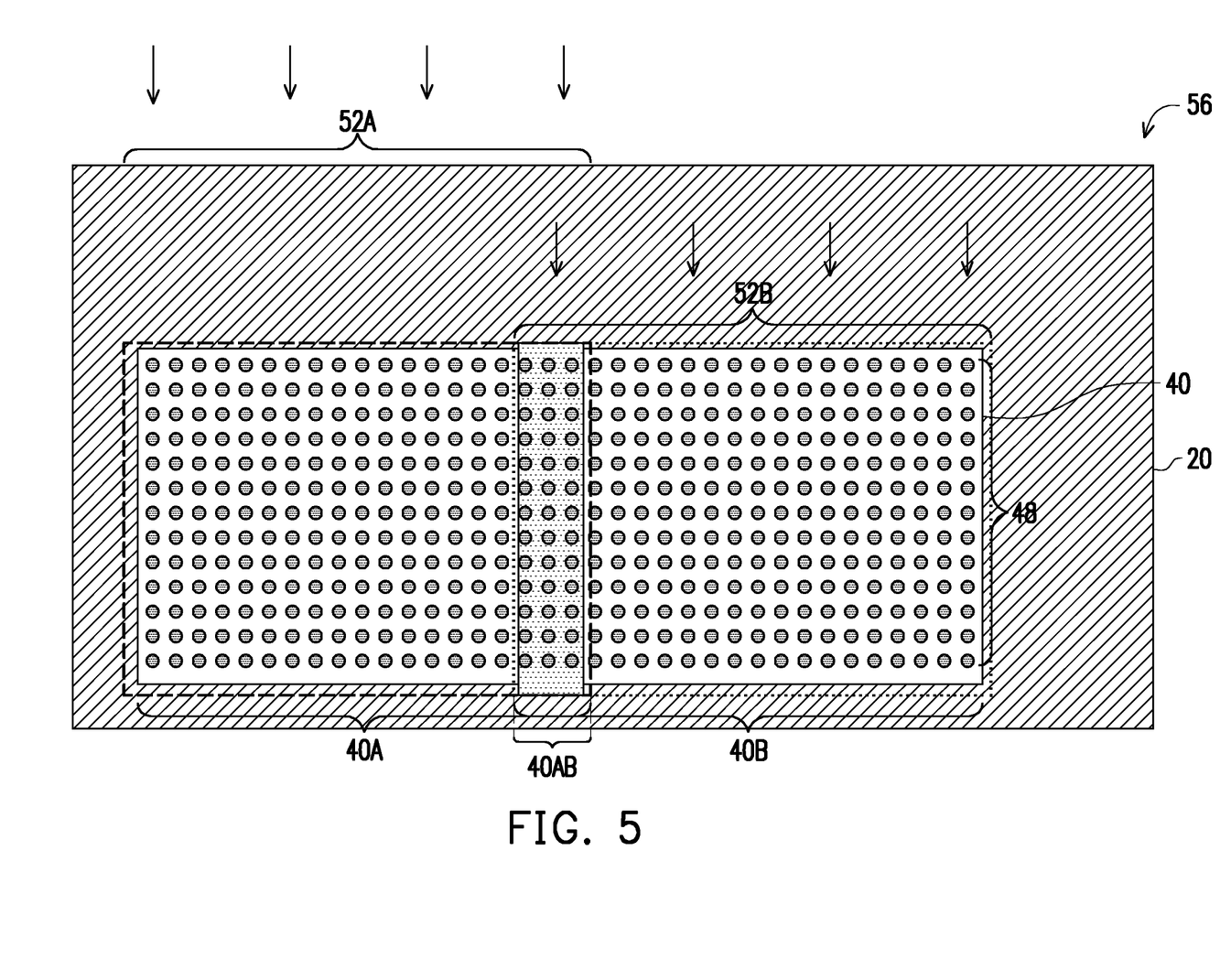
FIG. 5 illustrates a top view of a two-shot laser reflow process in accordance with some embodiments.
Figure 6:
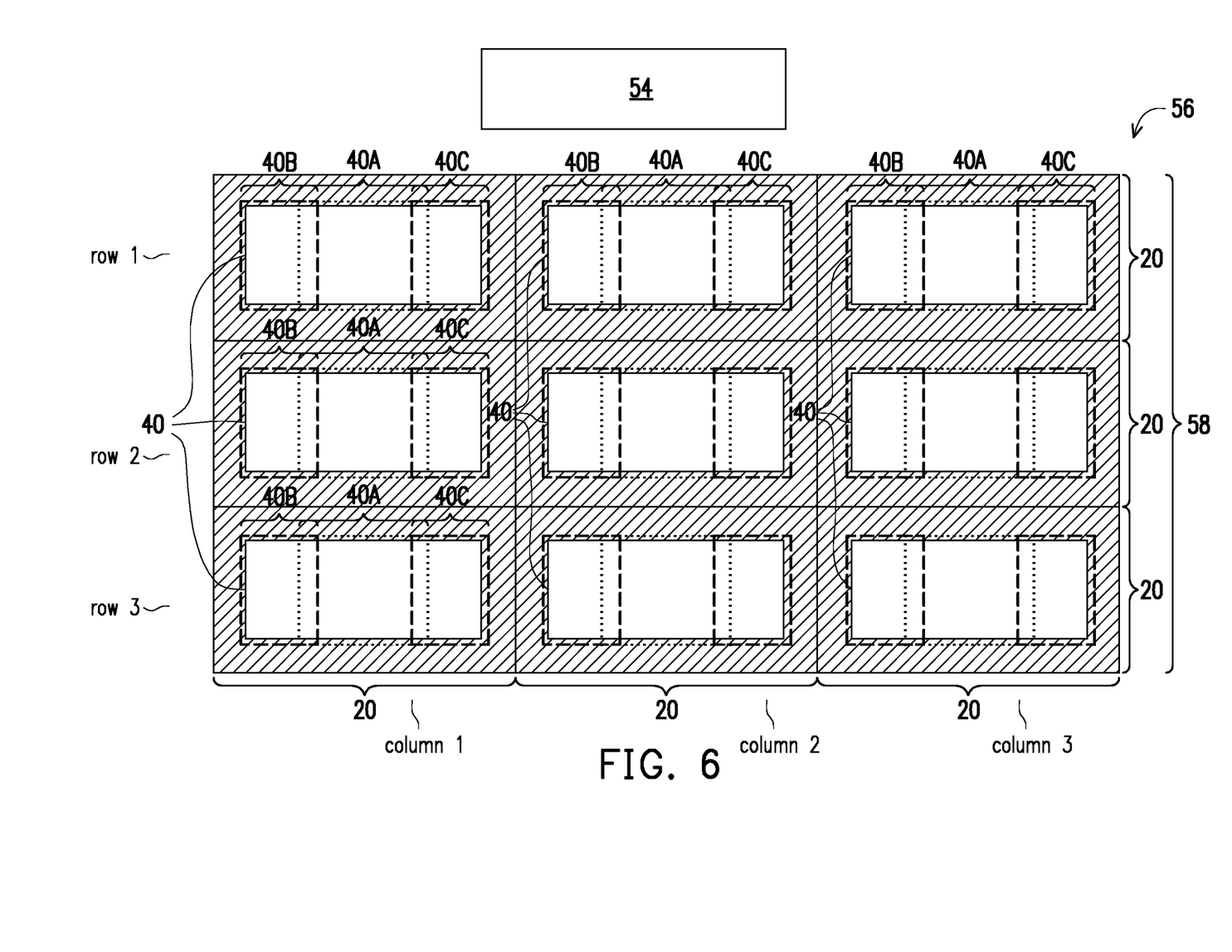
FIG. 6 illustrates a top view of multi-shot laser reflow processes performed on an array of bond packages in accordance with some embodiments.

FIGS. 2, 3, and 4 illustrate a reflow process, which includes a plurality of laser shots and hence a plurality of reflow processes. The reflow process shown in FIGS. 2, 3, and 4 is thus referred to as a multi-shot reflow process. The plurality of laser shots are performed using laser beam 52, which is generated by laser-beam generator 54. In each of the laser shots, laser beam 52 is projected on one region of the top surface of package component 40, so that heat is absorbed by package component 40 and conducted through package component 40 to solder regions 48, causing the reflow of solder regions 48. Laser-beam generator 54 is configured to generate the laser beam 52 that is much larger than a typical laser beam. For example, laser-beam generator 54 is configured to enlarge a small laser beam to a desirable larger size. Furthermore, as illustrated in FIGS. 4B, 5, and 6, laser beam 52 may cover a rectangular region. The power of different portions of laser beam 52 is uniform or substantially uniform, for example, with a variation smaller than about 10 percent throughout the rectangular region. Laser beam 52 is emitted out of an emitter in laser-beam generator 54. In each of the laser shots, the solder regions covered by laser beam 52 are reflowed simultaneously.

Referring to FIG. 2, a first laser shot 52A is performed at a first region 40A of package component 40. The respective process is illustrated as process 204 in the process flow shown in FIG. 10. In accordance with some embodiments of the present disclosure, region 40A is a middle region of package component 40. With laser beam 52 projected on region 40A, region 40A is heated, and the heat is transferred to the solder regions 48 directly under. The first laser shot is performed until solder regions 48B, 48C, and 48D, which are directly in the projecting path of laser beam 52, are molten and reflowed. Solder regions 48A and 48E receive less heat than solder regions 48B, 48C, and 48D, and are not reflowed. If package component 20 also includes solder regions, the solder regions in the projecting path of laser beam 52, are also molten and reflowed. In the first laser shot 52A, the duration and the unit power (power per unit area) of the first laser shot is controlled to ensure a majority of the solder regions (such as 48A and 48E) not in the projecting path of laser beam 52 are not molten and hence not reflowed. Accordingly, the duration of the first laser shot is long enough to melt solder regions 48B, 48C, and 48D, and short enough so that at least the majority of (or all of) solder regions 48A and 48E are not molten. FIG. 2 illustrates that none of the solder regions outside of the laser path is molten as an example. In accordance with some embodiments of the present disclosure, a small number of solder regions 48A and/or 48E that are outside of and close to region 40A are also molten, for example, due to process variation or increased process margin. The unit power of laser beam 52 is also selected to be high enough to melt solder regions 48B, 48C, and 48D, and low enough so that solder regions 48A and 48E are not molten. In accordance with some embodiments of the present disclosure, the duration of the laser shot is in the range between about 5 seconds and about 10 seconds. The unit power may be in the range between about 0.1 watts/mm$^2$ and about 0.4 watts/mm$^2$. It is appreciated that how long does it take for solder regions 48B, 48C, and 48D to melt affected by a combination of a plurality of factors rather than the factors individually, which factors include, and not limited to, the unit power, the shot duration, the thickness of package component 40, the materials and the thermal conductivity of package component 40, etc.

In accordance with some embodiments of the present disclosure, solder regions 48 have a melting temperature higher than about 200° C., and may be in the range between about 215° C. and about 230° C. as an example. After solder regions 48B, 48C, and 48D are molten and before solder regions 48A and 48E are molten, the first laser shot is ended.

After the first laser shot, laser beam 52 is turned off or cut off, and is stopped from being projected on package component 40. A second laser shot is then performed to reflow solder regions 48A in a second region 40B of package component 40, as shown in FIG. 3. Between the ending time of the first laser shot and the starting time of the second laser shot, a delay time is implemented. In accordance with some embodiments of the present disclosure, the delay is long enough so that the reflowed solder regions 48B, 48C, and 48D to cool down and solidify. For example, the temperature of solder regions 48B, 48C, and 48D may drop into the range between about 100° C. and about 150° C. after the delay time. The delay time may be in the range between about 5 seconds and 10 seconds in accordance with some embodiments.

As shown in FIG. 3, a second laser shot 52B is performed to cover the second region 40B of package component 40. The respective process is illustrated as process 206 in the process flow shown in FIG. 10. As a result, solder regions 40A and 40B, which are in the laser path, are reflowed. Solder regions 48C, 48D, and 48E, on the other hand, do not receive adequate heat, and are not molten and not reflowed. It is appreciated that some solder regions 48C that are close to region 40B may also be molten in accordance with some embodiments of the present disclosure, for example, due to process variation. In accordance with some embodiments of the present disclosure, the first region 40A and second region 40B have overlaps, and the corresponding overlap region is region 40AB (also refer to FIG. 4B). Overlapping regions 40A and 40B ensures that an entirety of package component 40 is covered by the multiple laser shots, and even if there is a process variation such as a misalignment in one of the laser shots, all solder regions 48 will be reflowed. In accordance with some embodiments of the present disclosure, there are some solder regions (such as 48B) in the overlap region 40AB. Solder regions 48B are thus reflowed twice, once in the first laser shot, and once in the second laser shot. Solder regions 48C and solder regions 48A, on the other hand, are reflowed once in the first laser shot and the second laser shot, respectively. In accordance with alternative embodiments of the present disclosure, there is no solder region in the overlap region 40AB, and no solder regions are reflowed twice in the first and the second laser shots.

After the second laser shot, a third laser shot 52C is performed to reflow solder regions 48D and 48E in a third region 40C of package component 40, as shown in FIG. 4A. The respective process is illustrated as process 208 in the process flow shown in FIG. 10. Package component 40 is thus bonded to package component 20 to form package 56, with all of the solder regions 48 between package components 20 and 40 being reflowed at least once. Between the ending time of the second laser shot and the starting time of the third laser shot, a delay time is implemented. In accordance with some embodiments of the present disclosure, the delay time is long enough to allow the reflowed solder regions 48A and 48B to cool down and solidify. For example, the temperature of solder regions 48A and 48B may drop into the range between about 100° C. and about 150° C. at the time the third laser shot is started. The delay time may be in the range between about 5 seconds and 10 seconds.

As shown in FIG. 4A, the third region 40C of package component 40 receives laser shot 52C, with solder regions 48D and 48E being in the laser path and reflowed, and solder regions 48A, 48B, and 48C being outside of the laser path. Solder regions 48A, 48B, and 48C thus do not receive adequate heat, and are not molten and not reflowed. It is appreciated that some solder regions 48C that are close to region 40C may also be molten in accordance with some embodiments of the present disclosure, for example, due to process variation. In accordance with some embodiments of the present disclosure, the first region 40A and third region 40C have overlaps, and the corresponding overlap region is region 40AC (also refer to FIG. 4B). Overlapping regions 40A and 40C ensures that an entirety of package component 40 is covered by the multiple laser shots, and regardless of process variations, all solder regions may be reflowed at once. In accordance with some embodiments of the present disclosure, there are some solder regions (such as 48D) in the overlap region 40AC. Solder regions 48D are thus reflowed twice, once in the first laser shot, and once in the third laser shot. Solder regions 48C and solder regions 48E, on the other hand, are reflowed once in the first laser shot and the third laser shot, respectively. In accordance with alternative embodiments of the present disclosure, there is no solder region in the overlap region 40AC, and hence no solder regions are reflowed twice during the first and the third laser shots.

Since there may be, or may not be, solder regions 48 in overlap region 40AB, and there may be, or may not be, solder regions 48 in overlap region 40AC, each of overlap regions 40AB and 40AC may, or may not, include solder regions 48 that are reflowed twice.

After the reflow process, underfill 57 may be dispensed into the gap between package components 20 and 40. Solder regions 59 may be placed on bottom conductive features 30 in order to bond package 56 to other package components such as a package substrate.

FIG. 4B illustrates a top view of the multi-shot reflow process, wherein the cross-sectional views shown in FIGS. 2, 3, and 4A are obtained from the plane containing line A-A in FIG. 4B. As shown in FIG. 4B, the multi-shot reflow process includes three laser shots, each covering a rectangular region. The three rectangular regions covered by laser shots 52A, 52B, and 52C may have the same area and the same shape. The combined region of the three laser shots fully covers package component 40. The combined region may extend beyond the edges of package component 40 slightly to provide enough, but not excess, process margin, so that it is ensured that all of package component 40 is covered by laser shots. On the other hand, package component 20 is substantially free from direct laser projection, except some small portions of package component 20 close to the edges of package component 40 may receive the laser shots.

In the example of the multi-shot reflow process, the middle region of package component 40 receives the laser shot first, followed by the left region and the right region of package component 40. The order can be adjusted to different orders. For example, the order may be adjusted as the left region first, followed by the middle region and then the right region. The order may also be adjusted as the left region first, followed by the right region and then the middle region.

FIG. 4B also illustrates overlap regions 40AB and 40AC, with each receiving two laser shots. Solder regions 48 are also illustrated schematically. It is appreciated that solder regions 48 may or may not be allocated as arrays. Some solder regions 48, which correspond to solder regions 48B and 48D in FIG. 4A, are in the overlap regions 40AB and 40AC, and hence are reflowed twice. In accordance with some embodiments of the present disclosure, overlap regions 40AB and 40AC have overlap width W1 in the range between about 1 mm and about 3 mm. Inside the overlap width W1, there may be a plurality of columns of solder regions 48, for example, more than ten columns, depending on the pitch of solder regions and the overlap width W1.

The multi-shot reflow process results in the local heating of package component 40 in each of the shots, rather than the global heating of the entire package component 40 at the same time. When a laser shot is performed after a preceding shot has ended, the increased temperature caused by the preceding laser shots has already dropped. The heating of package components 20 and 40 causes the warpage of package components 20 and 40, and the magnitude of the warpage is related to the temperature. With the reduced temperature, the warpage of package components 20 and 40 is reduced. In addition, the laser shots are projected on package component 40, and package component 20 receives a very small dose (if any) of the laser beam directly. Accordingly, package component 20 is not heated significantly, and the corresponding warpage is reduced.

In conventional convection reflow in which the packages to be bonded are passed on a conveyor belt, an entire package is heated when passing through a heating zone. Since the entirety of the package to be bonded is heated, and further due to the high thermal budget (for example, about 8 minutes) of the convection reflow, the warpage is severe. For example, in some sample packages formed through convection reflow, a reflowed solder close to a center of a package component may have a height of about 51.5 μm, while solder regions close to the edges of the package component may have heights of about 72 μm, which means that the warpage causes significant variation in standoff distances between different parts of the overlying and underlying package components. The standoff distance, when too large, may cause the respective solder regions unable to join to the respective conductive features in two package components. The standoff distance, when too small, may cause solder regions to be squeezed, resulting in the bridging of neighboring solder regions. As a comparison, when the multi-shot reflow in accordance with some of embodiments of the present disclosure is performed, all of the solder regions in a sample wafer, regardless of whether they are close to the center or the edges of the package components, have heights varying in the range between about 62.15 μm and about 61.98 μm, with the heights difference between solder regions being smaller than 1 μm, indicating that the warpage is substantially eliminated. As a result, the cold joint (which means un-bonded joints) is eliminated.

FIG. 5 illustrates a top view of a multi-shot reflow process, which includes two laser shots to cover an entire package component 40. For example, in the first laser shot 52A, region 40A of package component 40 is covered. Region 40A covers more than a half of package component 40. In the second laser shot 52B, region 40B of package component 40 is covered. Region 40B also covers more than a half of package component 40, with overlap region 40AB in the middle. The examples of solder regions 48 that are reflowed by the multi-shot reflow process are also illustrated.

The multi-shot reflow process may be performed at die level or at wafer level. For example, when the multi-shot reflow process is performed at the die level, the package component 20 as shown in FIGS. 2 through 4A may be a discrete component, which is not a part of a wafer or a substrate strip including a plurality of identical substrates. When the multi-shot reflow process is performed at the wafer level, the package component 20 as shown in FIGS. 2 through 4A may be a part of a wafer or a substrate strip including a plurality of identical substrates. For, example, FIG. 6 illustrates a part of package component 58, which includes a plurality of package components 20 therein. Package component 58 may be a wafer, a package substrate strip, or a composite wafer including a plurality of packages therein. A plurality of package components 40 are to be bonded to the respective package components 20 in package component 58 through multi-shot reflow processes. Package components 20 and 40 are allocated as an array including a plurality of rows (for example, row 1, row 2, and row 3), and a plurality of columns (for example, column 1, column 2, and column 3). In accordance with some embodiments of the present disclosure, the multi-shot reflow process includes performing the laser shots on first regions (such as regions 40A) of all package components 40 one-by-one. After all of the first regions of all package components 40 have received laser shots, laser shots are performed on second regions (such as regions 40B) of all package components 40 one-by-one, followed by the laser shots on third regions (such as regions 40C) of all package components 40 one-by-one. Through this order, no delay time between laser shots is needed since between a first laser and a second laser shot of a same package component 40, the laser shots are performed on other package components (which is actually the delay time between two laser shots of the same package component 40), allowing ample time for the package component 40 to cool down before the next laser shot. The throughput of the reflow process is thus improved. In accordance with alternative embodiments of the present disclosure, the laser shots may also be performed on regions 40A, 40B, and 40C of the same package component 40, and then the process proceeds to a next package component 40. In accordance with these embodiments, delay time may be allocated between the laser shots of the same package components 40. No delay time, however, is needed between the laser shots of different package components.

In the multi-shot reflow process, laser-beam generator 54 is also configured to control the sequence of the laser shots, so that each laser shot is performed on a selected region (such as 40A, 40B, and 40C) of a selected package component 40, and on selected package components in desirable orders, as discussed referring to FIGS. 2 through 5.

Figure 7:
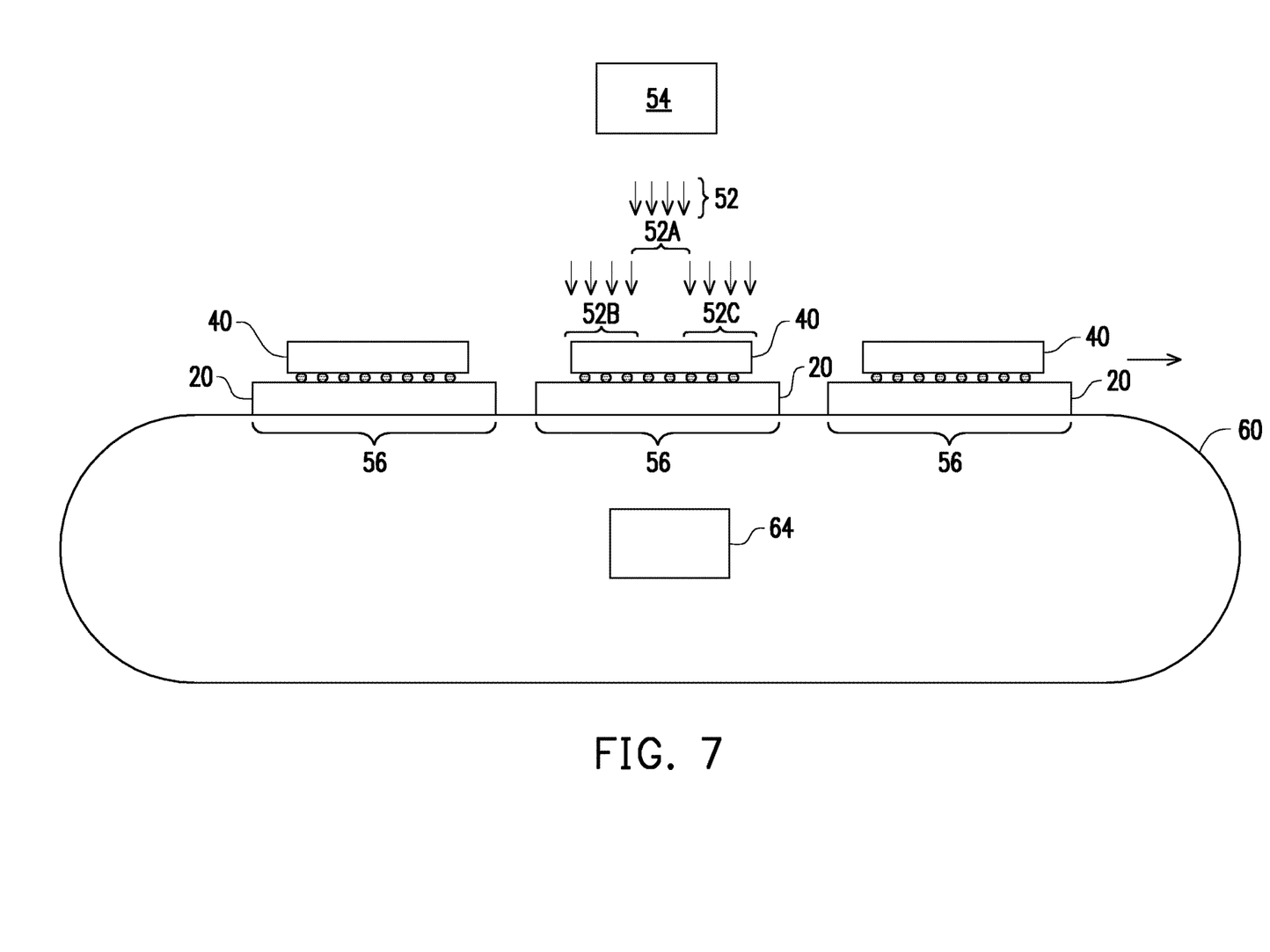
FIG. 7 illustrates a plurality of packages placed on a conveyor belt in a multi-shot laser reflow process in accordance with some embodiments.

FIG. 7 illustrates performing the multi-shot reflow process on packages transported on conveyer belt 60. A plurality of package components 20, on which package components 40 are placed, are placed on conveyer belt 60, and are transported forward. Laser-beam generator 54 is used to perform the multi-shot reflow process when packages 56 (which have not been bonded) passes underneath. Laser-beam generator 54 is configured to adjust the timing and the position of the laser shots to perform the multi-shot reflow process. Also, Laser-beam generator 54 may be connected to control unit 64 of conveyer belt to synchronize the transportation and the multi-shot reflow of the packages.

Figure 8A:
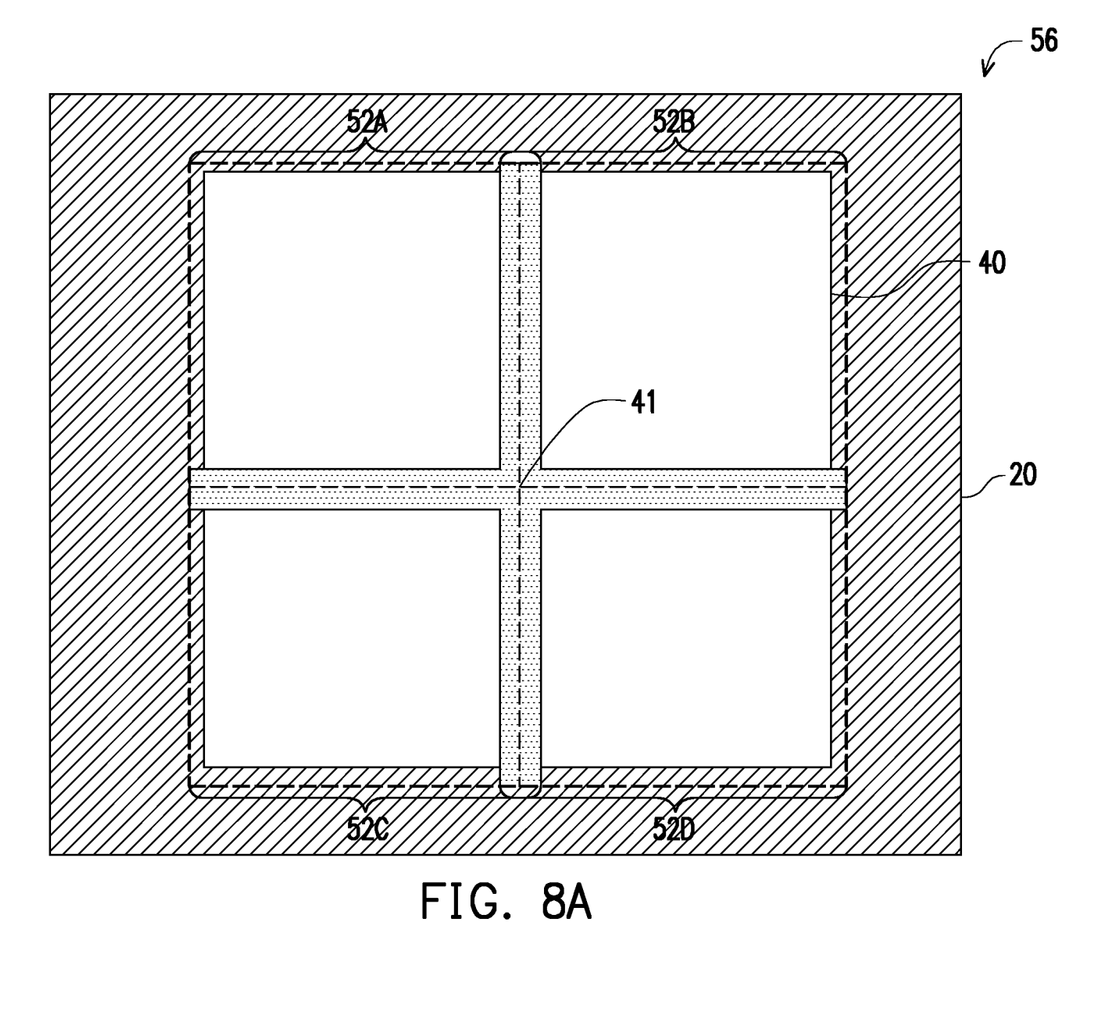
FIG. 8A illustrates a top view of a multi-shot laser reflow process including four laser shots, with each covering a corner of a device die in accordance with some embodiments.
Figure 8B:
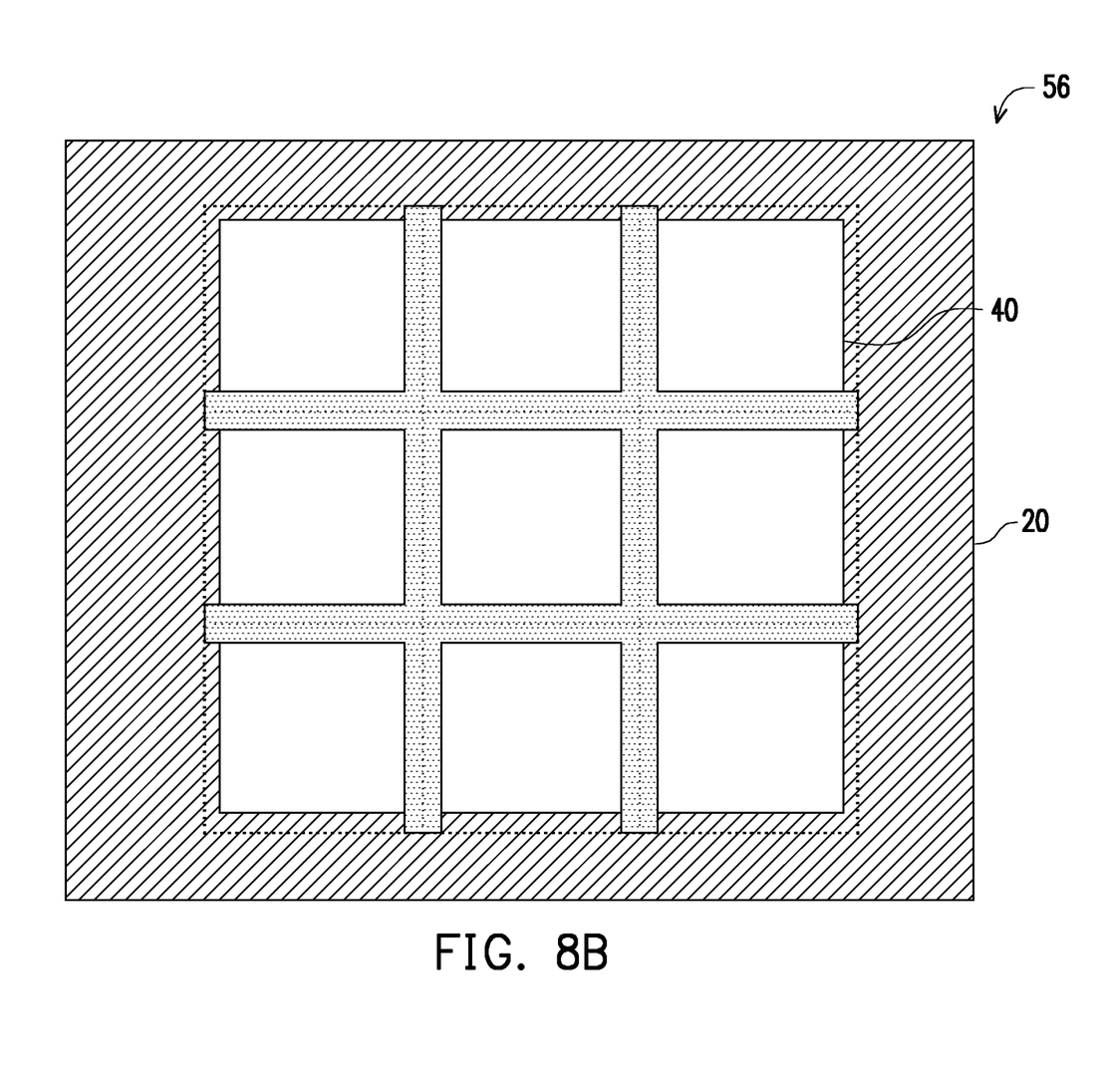
FIG. 8B illustrates a top view of a multi-shot laser reflow process including nine laser shots, with each covering one region of a device die in accordance with some embodiments.

In the examples as illustrated in FIGS. 2 and 5, package component 40 has an elongated top-view shape. In accordance with some embodiments of the present disclosure, package component 40 may have other shapes. For example, FIGS. 8A and 8B illustrate package components 40 having less-elongated shapes such as squares. In FIG. 8A, the multi-shot reflow process includes four laser shots 52A, 52B, 52C, and 52D, each covering a corner region of package component 40. Each of laser shots 52A, 52B, 52C, and 52D may also cover the center point of package component 40. As a result, the center point 41 receives four laser shots. The overlap regions of laser shots may in combination form a cross shape. The order of laser shots 52A, 52B, 52C, and 52D may be adjusted to any order as desirable. In FIG. 8B, the multi-shot reflow process includes nine laser shots each covering one region of package component 40 as illustrated. The overlap regions thus form a grid.

Figure 9:
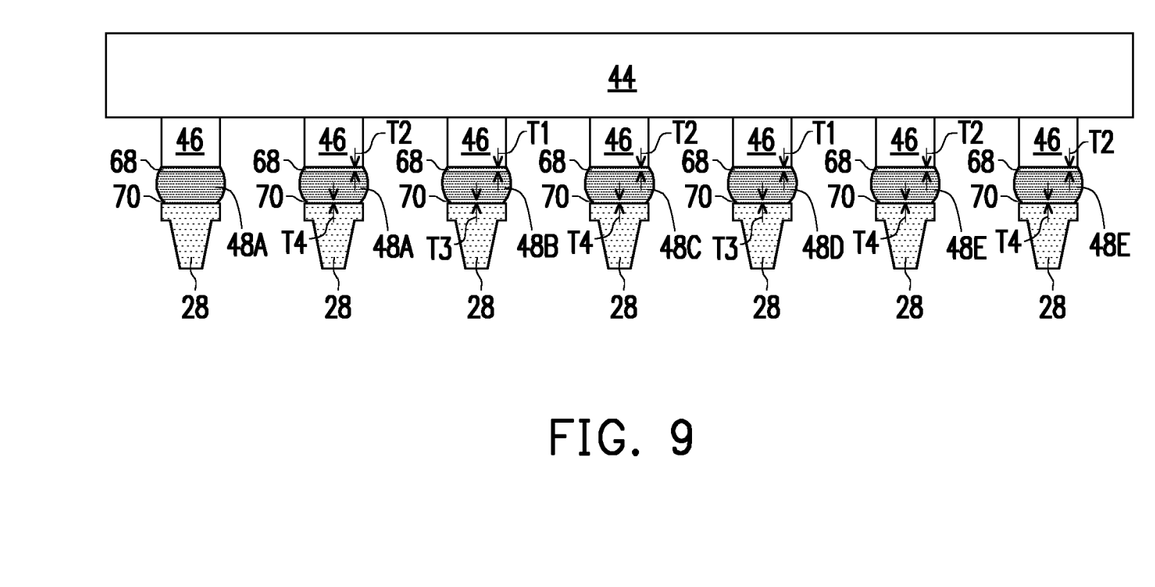
FIG. 9 illustrates the solder regions reflowed in a multi-shot laser reflow process in accordance with some embodiments.

FIG. 9 illustrates a cross-sectional view of solder regions 48 (including solders 48A through 48E, which are collectively and individually referred to as solder regions 48) and the overlying conductive features 46 and underlying top conductive features 28, which are also shown in FIG. 4A. The examples of solder regions 48A, 48B, 48C, 48D, and 48E are also illustrated. Solder regions 48B and 48D are reflowed twice, and solder regions 48A, 48C, and 48D are reflowed once. In the multi-shot reflow process, Inter-Metallic Compound (IMC) regions 68 and 70 are formed. IMC regions 68 and 70 are the compounds of the solder in solder regions 48 with the surface layers of conductive features 46 and top conductive features 28, respectively. Depending on the structure and the materials of conductive features 46 and top conductive features 28, IMC regions 68 and 70 may be the compounds of solder with nickel, copper, titanium, palladium, gold, aluminum, or the like. The corresponding IMC regions 68 and 70 are separated from each other by, and in contact with, the corresponding solder regions 48 that are not compounded with conductive features 46 and top conductive features 28. Due to the two (or more) reflow processes received by solder regions 48B and 48D, thicknesses T1 of IMC regions 68 of solder regions 48B and 48D (which are common solder regions receiving two or more laser shots) are greater than the thicknesses T2 of IMC regions 68 of solder regions 48A, 48C, and 48E. Ratio T1/T2 is greater than 1.0 and may be greater than about 1.2, and may be in the range between about 1.2 and about 2. In accordance with some embodiments of the present disclosure, thickness T1 is in the range between about 7.2 µm and about 8 µm, and thickness T2 is in the range between about 4 µm and about 6 µm. Similarly, thicknesses T3 of IMC regions 70 of solder regions 48B and 48D are greater than the thicknesses T4 of IMC regions 70 of solder regions 48A, 48C, and 48E. Ratio T3/T4 is greater than 1.0 and may be greater than about 1.2, and may be in the range between about 1.2 and about 2. In accordance with some embodiments of the present disclosure, thickness T3 is in the range between about 7.2 µm and about 8 µm, and thickness T4 is in the range between about 4 µm and about 6 µm.

As can be found from FIGS. 4B, 5, 8A, and 8B, the solder region 48 with thicker IMC regions 68 and 70 may be allocated in strips that extend from one edge of package component 40 to the opposite edge. In the resulting packages 56, there may be a single overlap strip or a plurality of overlap strips parallel to each other, which strips receive more than one (such as two or four) laser shots. The overlap strips may also form cross-shapes, grids, or the like.

The embodiments of the present disclosure have some advantageous features. By performing multi-shot reflow processes, the warpage of the package components are reduced, and defects such as cold joints and solder bridging are eliminated.

In accordance with some embodiments of the present disclosure, a method includes performing a first laser shot on a first portion of a top surface of a first package component. The first package component is over a second package component, and a first solder region between the first package component and the second package component is reflowed by the first laser shot. After the first laser shot, a second laser shot is performed on a second portion of the top surface of the first package component. A second solder region between the first package component and the second package component is reflowed by the second laser shot. In an embodiment, the first portion of the top surface overlaps a first plurality of solder regions, and the first plurality of solder regions are reflowed by the first laser shot; and the second portion of the top surface overlaps a second plurality of solder regions, and the second plurality of solder regions are reflowed by the second laser shot. In an embodiment, the first plurality of solder regions and the second plurality of solder regions comprise common solder regions. In an embodiment, the first plurality of solder regions are separate ones from the second plurality of solder regions. In an embodiment, the first solder region is solidified when the second laser shot is started. In an embodiment, the method further includes, after the second laser shot, performing a third laser shot on a third portion of the top surface of the first package component, wherein a third solder region between the first package component and the second package component is reflowed by the third laser shot. In an embodiment, the first laser shot and the second laser shot in combination cover more than a half of the top surface of the first package component.

In accordance with some embodiments of the present disclosure, a method includes performing a first laser shot on a top surface of a first package component, wherein the first package component is over a second package component, and a first solder region between the first package component and the second package component is molten by the first laser shot; delaying a period of time, wherein the first solder region is solidified during the period of time; and after the first solder region is solidified, performing a second laser shot on the top surface of the first package component to melt a second solder region between the first package component and the second package component. In an embodiment, the first laser shot is performed using a laser beam large enough to cover a first portion of a top surface of the first package component, and a first plurality of solder regions and a second plurality of solder regions are directly under the first portion of the top surface of the first package component. In an embodiment, the second laser shot is performed using the laser beam large enough to cover a second portion of the top surface of the first package component, and the second plurality of solder regions and a third plurality of solder regions are directly under the second portion of the top surface of the first package component. In an embodiment, the delaying the period of time comprises delaying for 5 seconds to 10 seconds. In an embodiment, in the first laser shot, a laser beam is performed on a top surface of the first package component, and heat is transferred through the first package component to the first solder region. In an embodiment, the first laser shot and the second laser shot cover a common part of a top surface of the first package component. In an embodiment, the method further includes, after the second solder region solidifies, performing a third laser shot on the top surface of the first package component to melt a third solder region between the first package component and the second package component. In an embodiment, the first laser shot covers a portion of a top surface of the first package component, and a power of the first laser shot is distributed substantially uniformly in the portion of the top surface of the first package component.

In accordance with some embodiments of the present disclosure, a package includes a first package component comprising a first metallic feature and a second metallic feature at a surface of the first package component; a second package component comprising a third metallic feature and a fourth metallic feature at a surface of the second package component; a first solder region joining the first metallic feature to the third metallic feature; a first Inter-Metallic Compound (IMC) between and adjoining the first metallic feature and the first solder region, wherein the first IMC has a first thickness; a second solder region joining a the second metallic feature to the fourth metallic feature; and a second IMC between and adjoining the second metallic feature and the second solder region, wherein the second IMC has a second thickness greater than the first thickness. In an embodiment, a ratio of the second thickness to the first thickness is greater than about 1.2. In an embodiment, the ratio is between about 1.2 and about 2. In an embodiment, the package further includes a first column of metallic features comprised in the first package component, with the first metallic feature being in the first column of metallic features; a first column of solder regions joined to the first column of metallic features, with the first solder region being in the first column of solder regions; a first column of IMCs joined to the first column of metallic features, with the first IMC being in the first column of IMCs; a second column of metallic features comprised in the first package component, with the second metallic feature being in the second column of metallic features; a second column of solder regions joined to the second column of metallic features, with the second solder region being in the second column of solder regions; and a second column of IMCs joined to the second column of metallic features, wherein all of the second column of IMCs are thicker than the first column of IMCs. In an embodiment, both the first column and the second column substantially extend from a first edge to a second edge of the first package component, with the first edge being parallel to the second edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a first laser shot on a first portion of a top surface of a first package component, wherein the first package component is over a second package component, and a first solder region between the first package component and the second package component is reflowed by the first laser shot;
after the first laser shot, allowing the first solder region to solidify; and
after the first solder region solidifies, performing a second laser shot on a second portion of the top surface of the first package component, wherein a second solder region between the first package component and the second package component is reflowed by the second laser shot.

2. The method of claim 1, wherein:
the first portion of the top surface overlaps a first plurality of solder regions, and the first plurality of solder regions are reflowed by the first laser shot; and
the second portion of the top surface overlaps a second plurality of solder regions, and the second plurality of solder regions are reflowed by the second laser shot.

3. The method of claim 2, wherein the first plurality of solder regions and the second plurality of solder regions comprise common solder regions.

4. The method of claim 2, wherein the first plurality of solder regions are separate ones from the second plurality of solder regions.

5. The method of claim 1 further comprising:
after the second laser shot, performing a third laser shot on a third portion of the top surface of the first package component, wherein a third solder region between the first package component and the second package component is reflowed by the third laser shot.

6. The method of claim 1, wherein the first laser shot and the second laser shot in combination cover more than a half of the top surface of the first package component.

7. A method comprising:
performing a first laser shot on a top surface of a first package component, wherein the first package component is over a second package component, and a first solder region between the first package component and the second package component is molten by the first laser shot;
delaying a period of time, wherein the first solder region is solidified during the period of time; and after the first solder region is solidified, performing a second laser shot on the top surface of the first package component to melt a second solder region between the first package component and the second package component.

8. The method of claim 7, wherein the first laser shot is performed using a laser beam large enough to cover a first portion of the top surface of the first package component, and a first plurality of solder regions and a second plurality of solder regions are directly under the first portion of the top surface of the first package component.

9. The method of claim 8, wherein the second laser shot is performed using the laser beam large enough to cover a second portion of the top surface of the first package component, and the second plurality of solder regions and a third plurality of solder regions are directly under the second portion of the top surface of the first package component.

10. The method of claim 7, wherein the delaying the period of time comprises delaying for 5 seconds to 10 seconds.

11. The method of claim 7, wherein in the first laser shot, a laser beam is performed on the top surface of the first package component, and heat is transferred through the first package component to the first solder region.

12. The method of claim 7, wherein the first laser shot and the second laser shot cover a common part of the top surface of the first package component.

13. The method of claim 7 further comprising, after the second solder region solidifies, performing a third laser shot on the top surface of the first package component to melt a third solder region between the first package component and the second package component.

14. The method of claim 7, wherein the first laser shot covers a portion of the top surface of the first package component, and a power of the first laser shot is distributed substantially uniformly in the portion of the top surface of the first package component.

15. A method comprising:
placing a first package component over a second package component;
performing a first laser shot on the first package component, wherein a first laser beam of the first laser shot covers a first region of the first package component, and a second region of the first package component is out of the first laser beam; and
performing a second laser shot on the first package component, wherein a second laser beam of the second laser shot covers the second region of the first package component, and the first region of the first package component is out of the second laser beam.

16. The method of claim 15, wherein between the first laser shot and the second laser shot, the first package component stops receiving laser energy.

17. The method of claim 15, wherein during both of the first laser shot and the second laser shot, a laser-beam generator used for the plurality of laser shots is kept still over the first package component.

18. The method of claim 15, wherein both of the first laser shot and the second laser shot cover a part of the first package component less than an entire top-view area of the first package component.

19. The method of claim 15, wherein an interval between the first laser shot and the second laser shot is long enough to allow solder regions molten by the first laser shot to solidify when the second laser shot is performed.

20. The method of claim 1, wherein the first laser shot and the second laser shot are performed using a laser beam, and the method further comprises turning off the laser beam between the first laser shot and the second laser shot.

* * * * *